United States Patent
Sawyer et al.

(10) Patent No.: US 7,327,179 B2
(45) Date of Patent: Feb. 5, 2008

(54) PULSE GENERATOR, OPTICAL DISK WRITER AND TUNER

(75) Inventors: David Albert Sawyer, Swindon (GB); Nicholas Paul Cowley, Wroughton (GB); Isaac Ali, Bristol (GB)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/466,242

(22) Filed: Aug. 22, 2006

(65) Prior Publication Data
US 2007/0047416 A1    Mar. 1, 2007

(30) Foreign Application Priority Data
Aug. 23, 2005    (GB) ................................. 0517217.6

(51) Int. Cl.
*G06F 1/04* (2006.01)
(52) U.S. Cl. ..................................... 327/291; 327/161
(58) Field of Classification Search ................... None
See application file for complete search history.

(56) References Cited

U.S. PATENT DOCUMENTS

| | | | | |
|---|---|---|---|---|
| 4,922,141 | A | | 5/1990 | Lofgren et al. |
| 5,764,598 | A | * | 6/1998 | Okayasu .................... 368/120 |
| 5,900,834 | A | * | 5/1999 | Kubinec .................... 342/115 |
| 5,939,912 | A | | 8/1999 | Rehm |
| 6,118,319 | A | * | 9/2000 | Yamada et al. ............. 327/291 |
| 6,239,627 | B1 | * | 5/2001 | Brown et al. ............... 327/116 |
| 6,297,680 | B1 | * | 10/2001 | Kondo ........................ 327/278 |
| 6,469,493 | B1 | * | 10/2002 | Muething et al. ......... 324/158.1 |
| 6,480,047 | B2 | * | 11/2002 | Abdel-Maguid et al. .... 327/161 |
| 6,741,522 | B1 | * | 5/2004 | Lin ............................. 368/118 |
| 6,865,145 | B2 | * | 3/2005 | Yamakura ................ 369/47.28 |
| 6,993,109 | B2 | * | 1/2006 | Lee et al. ................... 375/376 |
| 2002/0024366 | A1 | | 2/2002 | Ooishi et al. .............. 327/156 |
| 2002/0178391 | A1 | | 11/2002 | Kushnick .................... 713/500 |
| 2003/0071685 | A1 | | 4/2003 | Oyama |
| 2003/0099321 | A1 | * | 5/2003 | Juan et al. .................. 375/376 |

(Continued)

FOREIGN PATENT DOCUMENTS

JP         08274602         10/1996

OTHER PUBLICATIONS

GB Search Report, Application No.: 0517217.6, Dated Oct. 26, 2005.

*Primary Examiner*—Cassandra Cox
(74) *Attorney, Agent, or Firm*—Blakely, Sokoloff, Taylor & Zafman LLP

(57) ABSTRACT

A pulse generator is provided for generating pulses with a selectable variable width and/or delay. The pulse generator comprises an oscillator and a selecting arrangement for selecting how many of a first group of delay elements are connected in series for delaying the oscillator signal. Identical delay elements are connected in series to form a second group. A measuring circuit repeatedly measures the delay provided by the second group, for example providing output pulses whose width or duration is equal to the delay. A reference pulse generator generates a series of reference pulses, each of which is a predetermined fraction of the oscillator period. A control circuit compares the measurement and reference pulses to generate an error signal that is fed back to timing delay control inputs of all the delay elements such that the widths of the measurement and reference pulses are made substantially equal to each other.

18 Claims, 7 Drawing Sheets

U.S. PATENT DOCUMENTS

| | | | |
|---|---|---|---|
| 2003/0179842 A1 | 9/2003 | Kane et al. | 375/376 |
| 2005/0017777 A1* | 1/2005 | Jung | 327/158 |
| 2005/0174911 A1 | 8/2005 | Shutoku et al. | 369/59.1 |
| 2005/0285643 A1* | 12/2005 | Lee | 327/158 |

* cited by examiner

PULSE GENERATOR, OPTICAL DISK WRITER AND TUNER

CROSS-REFERENCE TO RELATED APPLICATIONS

This application claims benefit of British Patent Application Serial Number 0517217.6, filed Aug. 23, 2005, which is herein incorporated by reference.

BACKGROUND OF THE INVENTION

1. Field of the Invention

Embodiments of the present invention relate to a pulse generator for generating pulses with a selectable variable width and/or delay. Such an arrangement may be used in any system where an accurately designed phase shift or variable pulse width or delay is required. For example, such an arrangement may be used for generating an accurate digitally controlled pulse in an optical disk writer, such as a DVD writer. Such an arrangement may also be used as part of a system for correcting quadrature error in a quadrature frequency changer of a radio frequency tuner. Thus, embodiments of the present invention also relate to an optical disk writer and a tuner including such a pulse generator.

2. Description of the Related Art

FIG. 1 of the accompanying drawings illustrates a conventional quadrature frequency converter. Such a frequency converter may be used, for example, in radio frequency tuners, and an example of an upconverter of this type is disclosed in British Patent Application No. 0511585.2. Such frequency changers may also be used in modulators where cancellation of a sideband is required.

The frequency changer comprises an in-phase (I) mixer 1 and a quadrature (Q) mixer 2, which are shown as receiving separate input signals but which may in other examples receive a common input signal. A local oscillator 3 supplies signals, which may be of fixed or variable frequency, to a quadrature splitter 4. The splitter 4 generates commutating signals which are in phase-quadrature and supplies these to the mixers 1 and 2. The outputs of the mixers 1 and 2 are supplied to a summer 5, which forms the vectorial sum of the output signals of the mixers. The resulting signal is amplified by an amplifier 6 and supplied to an output 7 of the frequency changer.

Where such a frequency changer is used in order to suppress or substantially cancel a sideband, for example including an image channel in a tuner, the quality of suppression depends on the quadrature phase balance between the commutating signals supplied by the splitter 4 and between the input signals supplied to the mixers 1 and 2. In the case of the commutating signals, known arrangements cannot achieve better than a 1-2° phase balance because of normal manufacturing spreads and tolerances that occur in practice. This therefore limits the suppression performance of such a frequency changer for normal applications, and special measures are necessary in order to improve the quadrature balance.

U.S. Patent Application Publication 2003/0071665 discloses a frequency multiplying arrangement using delay elements whose individual delays are non-controllable.

U.S. Pat. No. 4,922,141 and Japanese Patent No. 08274602 disclose phase-locking arrangements for delay lines which delay incoming signals. For example, U.S. Pat. No. 4,922,141 discloses a phase-locked loop delay line having two strings of delay elements, where the delay provided by each element is controllable. One string of elements is used to delay a data signal, whereas the other string is used inside a phase-locked loop arrangement for controlling the individual delay element delays. A delayed oscillator signal is compared with the non-delayed signal with the total delay being intended to be equal to one period of the oscillator signal. A charge pump is pumped up or down depending on the relative delay between the same edges of the direct and delayed signals, and the output of the charge pump varies the delay element delays so as to phase-lock the system. The delay provided by each delay element is thus fixed and determined so that the data signal to the independent string of delay elements can be delayed by a stable and well-defined amount.

Accordingly, what is needed is a pulse generator with improved width and/or delay control.

SUMMARY OF THE INVENTION

One embodiment of the invention provides for a pulse generator for generating pulses with a selectable variable width and/or delay. The pulse generator generally includes an oscillator; a selecting arrangement; a plurality of variable delay elements of the same type arranged as first and second groups, each delay element having a delay control input for controlling the delay ($T_D$) provided by the element, the selecting arrangement being arranged to select how many of the delay elements of the first group are connected in series to an output of the pulse generator, the delay elements of the second group being connected in series, the inputs of the first and second groups being connected to the output of the oscillator; a measuring circuit for repeatedly measuring the delay (IPD) provided by the second group; a reference pulse for generating a series of reference pulses (RP), each of which is of predetermined duration (IRD) equal to a predetermined fraction of the period of output pulses (IF clock) of the oscillator; and a control circuit whose output is connected to the delay control inputs of all of the delay elements and which is arranged to control the delay ($T_D$) provided by each element such that each measured delay (IPD) has a predetermined relationship with the predetermined duration (IRD).

Other embodiments include an optical disc writer and a tuner comprising the pulse generator described in the embodiment above.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Like reference numerals refer to like parts throughout the drawings.

DETAILED DESCRIPTION

Figure 1:
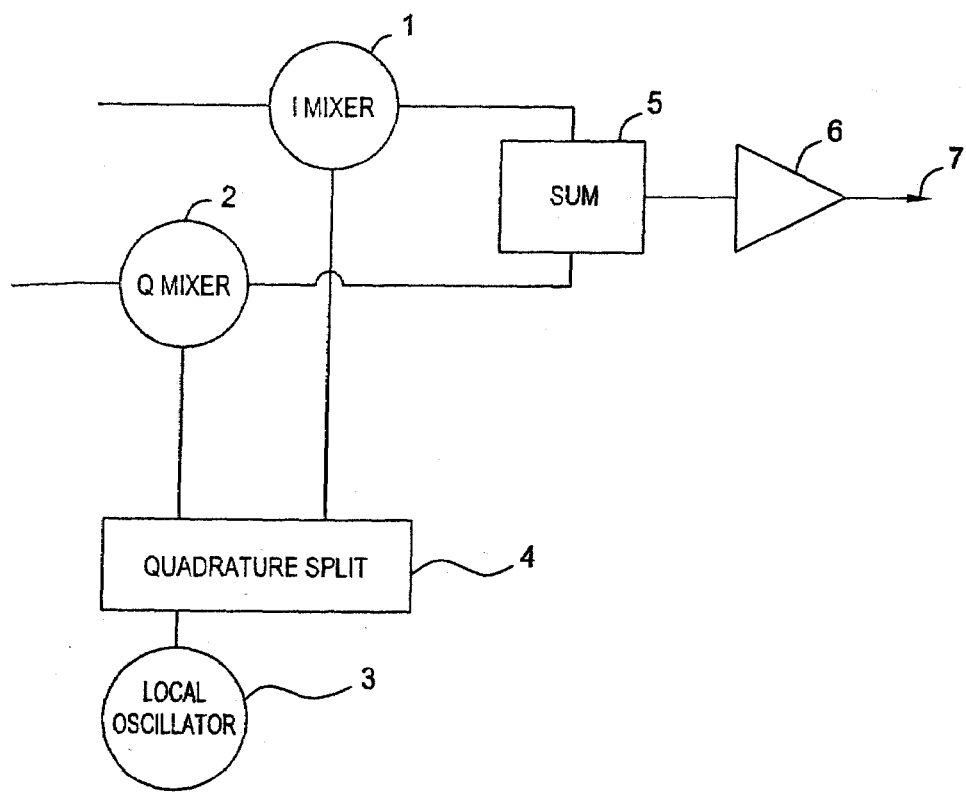
FIG. 1 is a prior art block circuit diagram of a known type of frequency changer.
Figure 2:
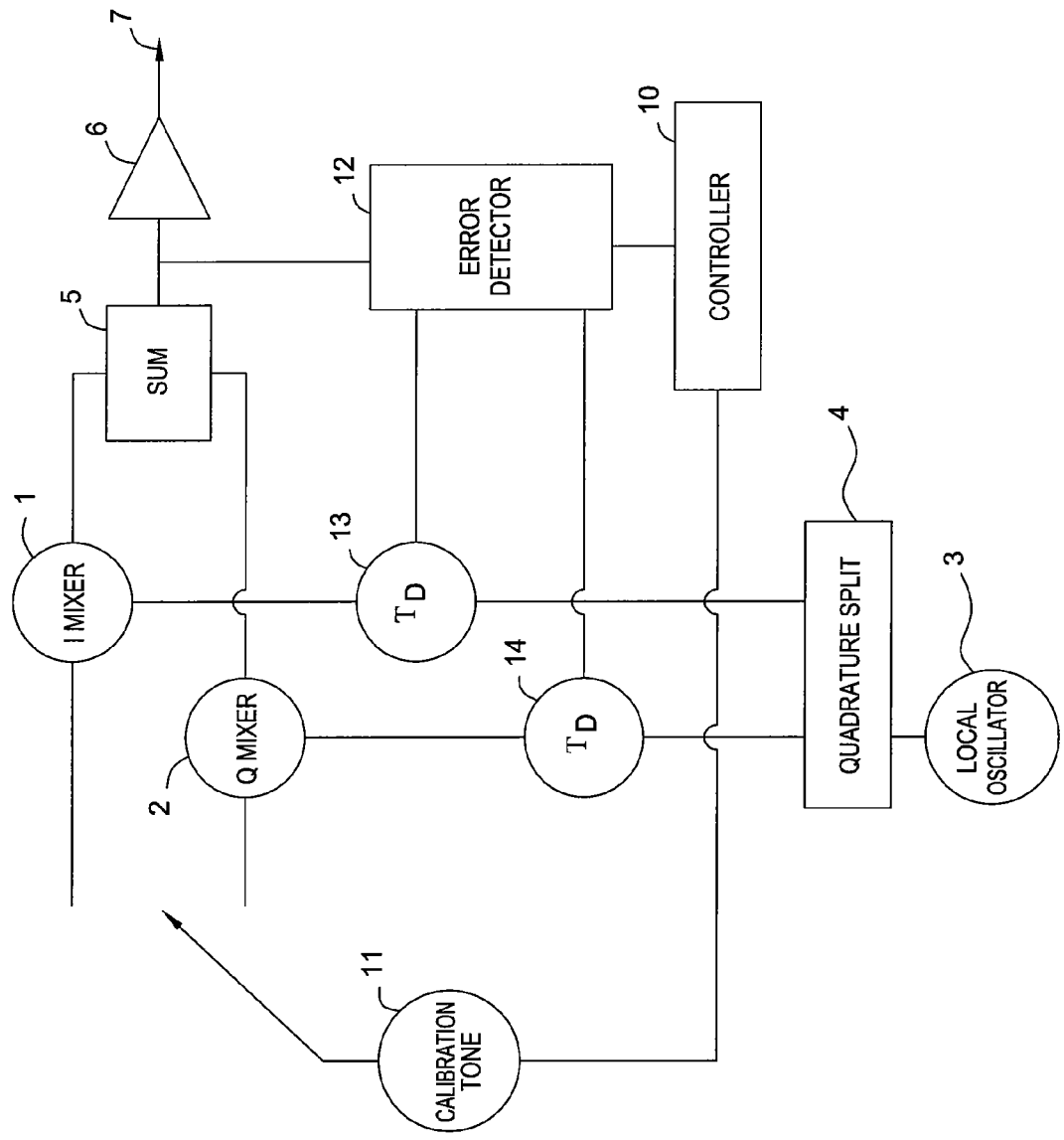
FIG. 2 is a block circuit diagram of a frequency changer for a radio frequency tuner including a pulse generator in accordance with an embodiment of the invention.

By way of example and without loss of generality, FIG. 2 illustrates the use of a pulse generator in a quadrature frequency changer operating as an upconverter. The frequency changer shown in FIG. 2 is of a similar type to that shown in FIG. 1 and comprises I and Q mixers 1 and 2, a local oscillator 3 and quadrature splitter 4, a summer 5, an amplifier 6 and an output 7, which will not be described further.

The frequency changer may also comprise a controller 10, which may control a calibration routine for reducing quadrature phase imbalance in the commutating signals supplied to the mixers 1 and 2. The calibration routine may be performed repeatedly, for example, on powering up a tuner containing the frequency changer and possibly at additional times, such as when tuning to a different channel. During the calibration routine, the controller 10 may cause a calibration tone generator 11 to be actuated and to supply a predetermined calibration tone to a point upstream of the mixers 1 and 2, for example at a point ahead of all frequency conversion within a tuner of which the frequency changer is part. An error detector 12 may monitor the output signal of the summer 5 and supply correction signals to variable delay circuits 13 and 14 in an effort to reduce any quadrature phase imbalance between the signals supplied by the splitter 4.

Figure 3:
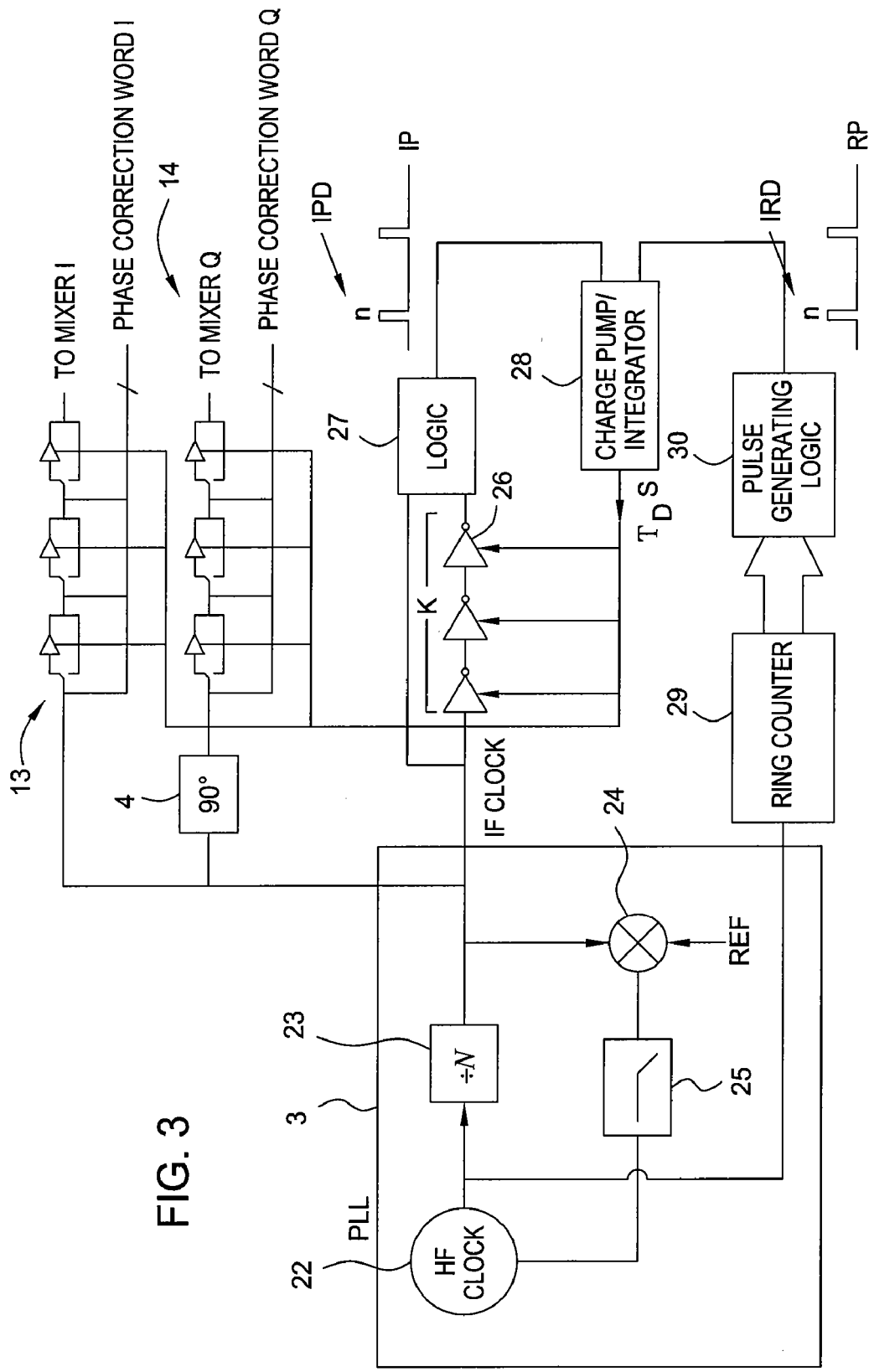
FIG. 3 is a block circuit diagram of the pulse generator of the tuner of FIG. 2 in accordance with an embodiment of the invention.
Figure 4:
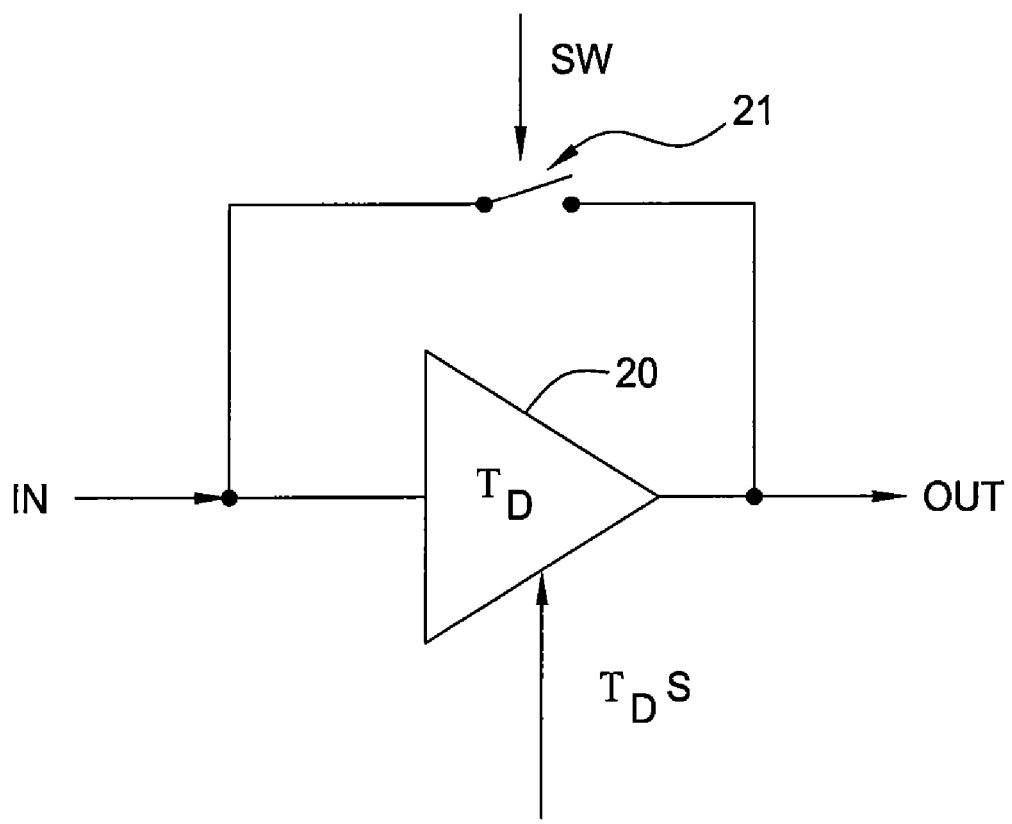
FIG. 4 is a block diagram of a delay element of the pulse generator of FIG. 3 in accordance with an embodiment of the invention.

The pulse generator is shown in more detail in FIG. 3 and may include the local oscillator 3, the quadrature splitter 4, and the delay circuits 13 and 14. Each of the delay circuits 13 and 14 may comprise a plurality of identical delay elements 20 illustrated in FIG. 4 and arranged to delay a signal between the input and output of the element 20 by a delay time $T_D$ which should be variable and may, for example, be continuously variable. The delay time $T_D$ of an individual delay element 20 may be controlled by a control signal $T_D S$. A switching arrangement may be provided for selecting how many of the delay elements 20 are connected in series to form the delay circuit 13. The switching arrangement may comprise electronic switches, such as the switch 21 illustrated in FIG. 4, and the control inputs of the switching arrangement may be connected to receive a phase correction word I from the error detector 12 for applying the appropriate signal delay to the I commutating signals for reducing phase imbalance.

The delay circuit 14 may have the same circuit arrangement as the circuit 13 with the switching arrangement being controlled by a phase correction word Q from the error detector 12. Thus, during the calibration routine, the error detector 12 may supply the phase correction words to the delay circuits 13 and 14 for providing the appropriate delays to the commutating signals in an effort to reduce phase imbalance. At the end of the calibration routine, the phase correction words may be held so as to maintain the selected signal time delays until the next calibration routine is performed.

Figure 5:
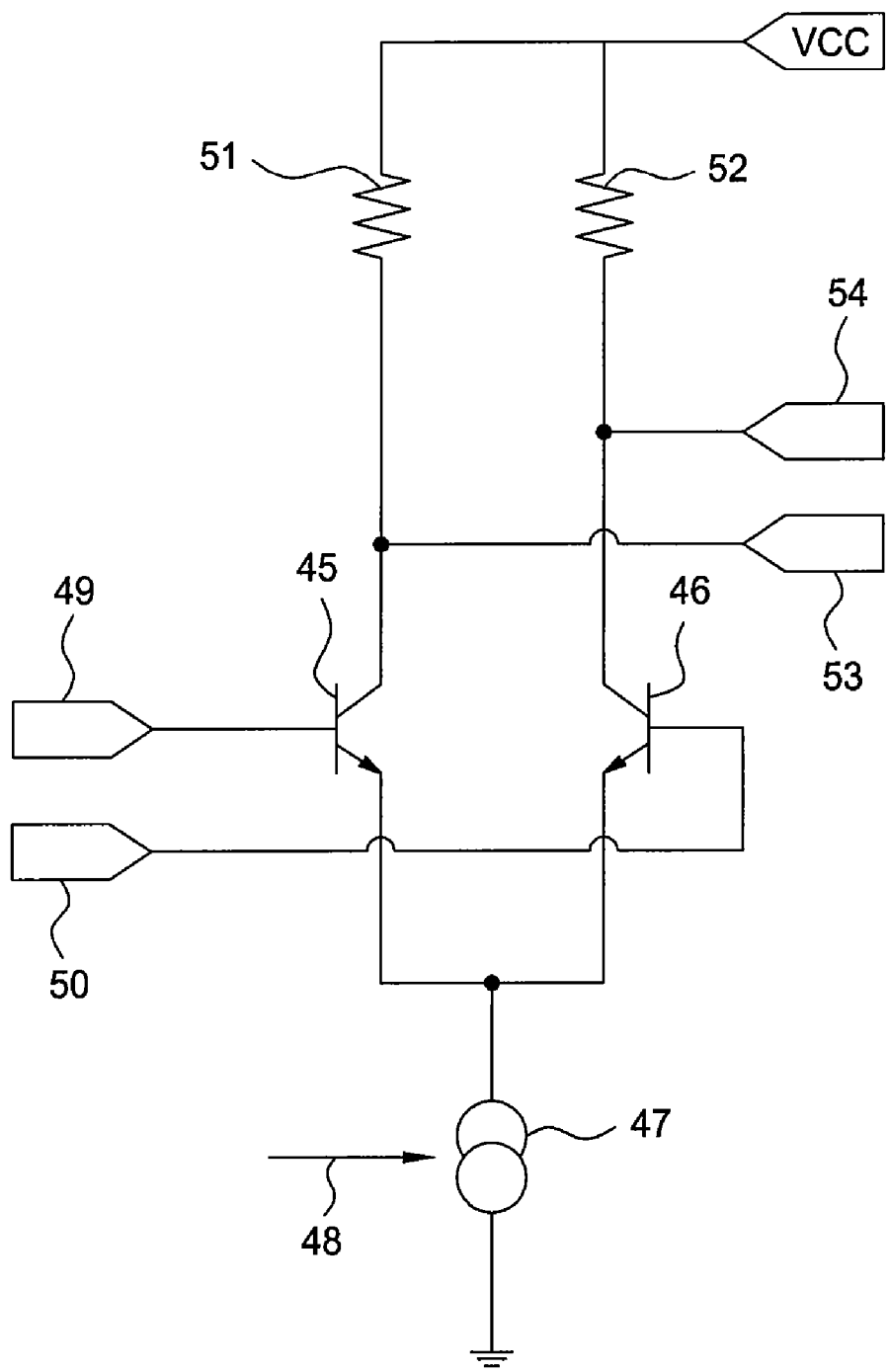
FIG. 5 is a circuit diagram of an example of the delay element of FIG. 4 in accordance with an embodiment of the invention.

An example of a circuit suitable for use in the variable delay elements 20 is illustrated in FIG. 5. The delay element shown in FIG. 5 is in the form of a differential transconductance stage comprising a long-tail pair of transistors 45 and 46, whose emitters are connected together and to a controllable current source 47 having a control input 48 for controlling the current through the source 47. The transistors 45 and 46 are shown as bipolar NPN transistors but may alternatively comprise bipolar PNP transistors or field effect transistors of either polarity.

The delay element may have differential inputs 49 and 50 connected to the bases of the transistors 45 and 46, respectively. The transistors 45 and 46 may be provided with collector load resistors 51 and 52, respectively, whose upper ends may be connected to a voltage supply line Vcc. The collectors of the transistors 45 and 46 may be connected to differential outputs 53 and 54, respectively.

The delay element of FIG. 5 makes use of the transition delay which is fundamental to the operation of semiconductor devices. The magnitude of the delay provided by the delay element 20 is inversely proportional to the parameter $f_T$ of the devices 45 and 46, where $f_T$ is the frequency at which the gain of the device has fallen to unity as frequency increases. The parameter $f_T$ is a fundamental property of the semiconductor process in which the delay element may be implemented and is also dependent on the bias current. The bias current may be determined by the control signal supplied to the control input 48 and controlling the current supplied by the current source 47, so that the delay provided by the delay element of FIG. 5 may be varied continuously.

In use, the control signal for controlling the delay provided by each of the variable delay circuits 13, 14 may be supplied to the control inputs 48 of the delay elements forming the delay circuit. Each delay element may slow down the rising and falling edges of signals or pulses passing through it by an amount which is dependent on the current provided by the current source 47 such that lower currents provide slower rising and falling edges. If necessary, one or more Schmitt triggers may be provided, for example, at the output of the variable delay circuits and possibly at the output of one or more intermediate delay elements. The signal supplied to each of the delay circuits 13,14 may thus be delayed by a continuously variable amount.

Referring back to FIG. 3, the local oscillator 3 may comprise a phase locked loop (PLL). The PLL may comprise a high frequency (HF) clock 22, whose output may be supplied to a frequency divider 23 arranged to divide the frequency of the clock 22 by an integer N, which may be fixed or may be selectable or controllable in an effort to vary the frequency of the commutating signals supplied to the mixers 1 and 2. The output of the divider 23 may form the output of the local oscillator and may also be connected to a first input of a phase comparator 24, whose second input is arranged to receive a reference frequency signal from a reference oscillator (not shown). The output of the comparator 24 may be supplied via a control arrangement 25 including a low pass filter function to a control input of the clock 22.

The quadrature splitter 4 is illustrated in FIG. 3 as comprising a phase shifting circuit 4 for shifting the phase of the incoming signal from the local oscillator 3 by 90°. However, any suitable arrangement may be used as a splitter 4 and an example of such an alternative arrangement is a ring counter clocked by the output of the divider 23.

The output of the local oscillator 3 may also be supplied to a group of (in this example K) delay elements such as 26. The delay elements of this group may be connected in series between the output of the local oscillator 3 and the input of a logic circuit 27, having a further input which may receive the output of the local oscillator directly. The logic circuit 27 produce a series of pulses IP having a repetition rate equal to the frequency of the output signal of the local oscillator 3 and a pulse length or duration IPD equal to the total time delay provided by the K series-connected delay elements such as 26. The output of the logic circuit 27 may be supplied to a "charge" input of a charge pump and integrator 28.

The output of the clock 22 may also be supplied to the input of a ring counter 29, whose outputs may be decoded by pulse generating logic 30 so as to provide a series of pulses RP. The counter 29 and the logic 30 may be such that each of the pulses RP has a width or duration IRD equal to the period of the signals from the clock 22 multiplied by a coefficient. In this example, the pulse width IRD is equal to half the period of the signals from the clock 22. The pulses RP may be supplied to a "discharge" input of the charge pump and integrator 28. The output of the charge pump and integrator 28 may supply the delay element control signal $T_DS$ to the control inputs of all of the delay elements, such as 26 and 20.

The charge pump and integrator 28 may effectively compare the durations of the pulses IP and RP to form an error signal which may be supplied to the control inputs of the K delay elements such as 26 in an effort to vary the delay provided by each element until the duration of each pulse IP is substantially equal to the duration IRD of each pulse RP. The duration of each pulse IP may be equal to $K \times T_D$, whereas the duration of each pulse RP may be equal to ½F, where F is the frequency of the clock 22. When the pulse widths have been made equal by the feedback loop including the charge pump and integrator 28, the delay $T_D$ of each of the delay elements may be equal to $1/(2 \times F \times K)$. F and K should be well-defined so that the delays provided by all of the delay elements, including those in the delay circuits 13 and 14, are held substantially constant. Thus, any drift in the delay time $T_D$ provided by each delay element may be greatly reduced or substantially eliminated so that accurate, consistent and substantially drift-free signal delays are provided by the delay elements in the delay circuits 13 and 14 selected by the phase correction words from the error detector 12. Thus, the compensation determined during each calibration routine may be held substantially constant until a following calibration routine is performed, and any tendency of the time delays provided by the delay elements to drift with time may be eliminated or reduced to an acceptable level for providing improved performance of the quadrature frequency conversion.

In embodiments where it is desired to be able to vary the clock frequency while maintaining constant values of phase shift in the circuits 13 and 14 irrespective of clock frequency, the divider 23 may be arranged to provide a fixed division ratio and the frequency of the clock 22 may be varied, for example, by providing a variable frequency reference signal to the second input of the phase comparator 24. In this case, the time delay $T_D$ provided by each delay element should track the period of the clock because the reference pulses IR have a width of half the clock period irrespective of the clock frequency. Thus, the relative phases of the output signals from the circuits 13 and 14 may remain substantially constant, for given phase correction words I and Q, irrespective of the frequency of the clock 22.

Figure 6:
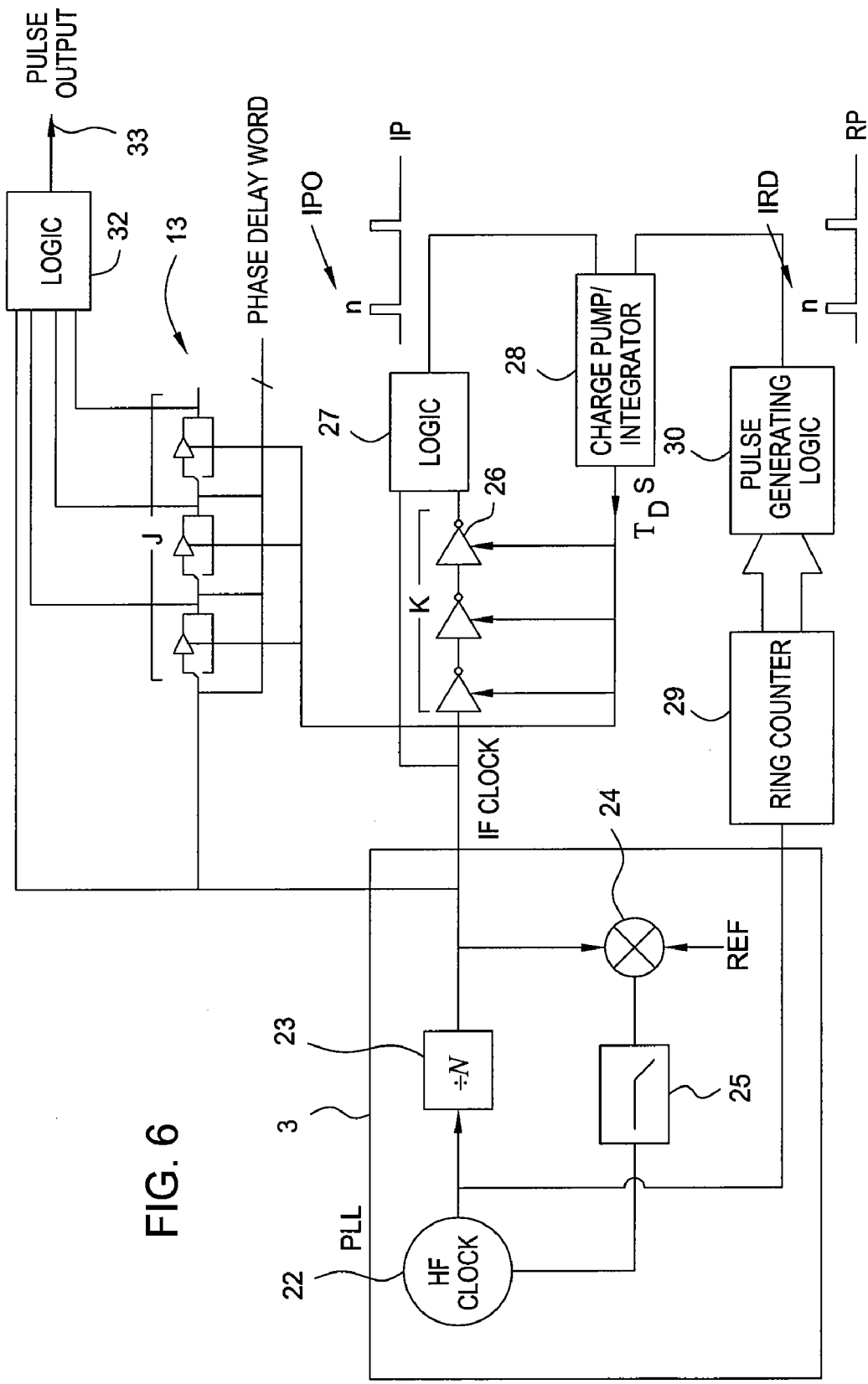
FIG. 6 is a block circuit diagram of a pulse generator in accordance with an embodiment of the invention.

FIG. 6 illustrates a pulse generator for generating a known accurate pulse duration or width, which may be selected from a range of widths by applying a phase delay word from an external source. As portrayed, this pulse generator differs from the pulse generator shown in FIG. 3 in that the delaying circuit 14 is omitted and a logic circuit 32 is connected to receive the local oscillator signal and the outputs of the J delay elements of the delaying circuit 13. The logic circuit 32 may be arranged to produce a series of output pulses with the same repetition rate as the frequency of the local oscillator 3 and with a pulse width proportional or equal to the total delay of the number of delay elements selected by the phase delay word to be connected in series. It may also be possible for the start of each pulse to be delayed relative to the local oscillator signal by selecting, within the logic circuit 32, which of its inputs are used for generating each pulse. The logic circuit 32 thus may supply to the pulse output 33 pulses of width or duration $MT_D$, where M is an integer greater than or equal to 1 and is the number of delay elements used by the logic circuit 32 for generating the output pulses.

Such a pulse generator may be used to generate pulses of selectable, accurate, and consistent widths which may not be substantially subject to drift during operation. In particular, the consistency should be substantially determined by the stability of the reference signals supplied to the second input of the phase comparator 24. Such an arrangement may be used in any application requiring such a pulse signal, and an example of such an application is in a DVD (digital versatile disk) writer.

As described hereinbefore, the time delay $T_D$ provided by each delay element 20 may be dependent on the frequency of the HF clock 22. By making the frequency of this clock 22 continuously or substantially continuously variable, for example, by varying the frequency of the reference signal supplied to the second input of the phase comparator 24, a pulse duration that is continuously or "infinitely" variable may be provided. In particular, J delay elements may be available in the delay circuit 13, and the logic circuit 32 may generate the output pulses based on the outputs of any two different ones of the delay elements. The resulting pulse width $IP_M$ may be given by:

$$IP_M = M \times T_D$$

Substituting for $T_D$;

$$IP_M = M \times \frac{1}{2 \times HF\, \text{Clock}_M \times K}$$

The next quantized step should lie at M+1, hence;

$$IP_{M+1} = (M+1) \times \frac{1}{2 \times HF\, \text{Clock}_M \times K}$$

This change may also be accomplished by varying HF Clock;

$$IP_{M+1} = M \times \frac{1}{2 \times HF\, \text{Clock}_{M+1} \times K}$$

Rearranging;

$$HF\ \text{Clock}_{M+1} = M \times \frac{1}{2 \times IP_{M+1} \times K}$$

and $$HF\ \text{Clock} = M \times \frac{1}{2 \times IP_M \times K}$$

Therefore the change in clock frequency to achieve the equivalent of one $T_D$ step is $$\Delta HF\ \text{Clock} = HF\ \text{Clock}_{M+1} - HF\ \text{Clock}_M$$

$$\Delta HF\ \text{Clock} = M \times \frac{1}{2 \times IP_{M+1} \times K} - M \times \frac{1}{2 \times IP_M \times K}$$

$$\Delta HF\ \text{Clock} = \frac{M}{2 \times K} \times \left( \frac{1}{IP_{M+1}} - \frac{1}{IP_M} \right)$$

Substituting for $IP_M$ $$\Delta HF\ \text{Clock} = \frac{M}{2 \times K} \times \left( \frac{1}{(M+1) \times T_D} - \frac{1}{M \times T_D} \right)$$

$$\Delta HF\ \text{Clock} = \frac{M}{2 \times K \times T_D} \times \left( \frac{1}{(M+1)} - \frac{1}{M} \right)$$

$$\Delta HF\ \text{Clock} = \frac{M}{2 \times K \times T_D} \times \left( \frac{M - (M+1)}{(M+1) \times M} \right)$$

$$\Delta HF\ \text{Clock} = \frac{-1}{2 \times K \times T_D \times (M+1)}$$

Figure 7:
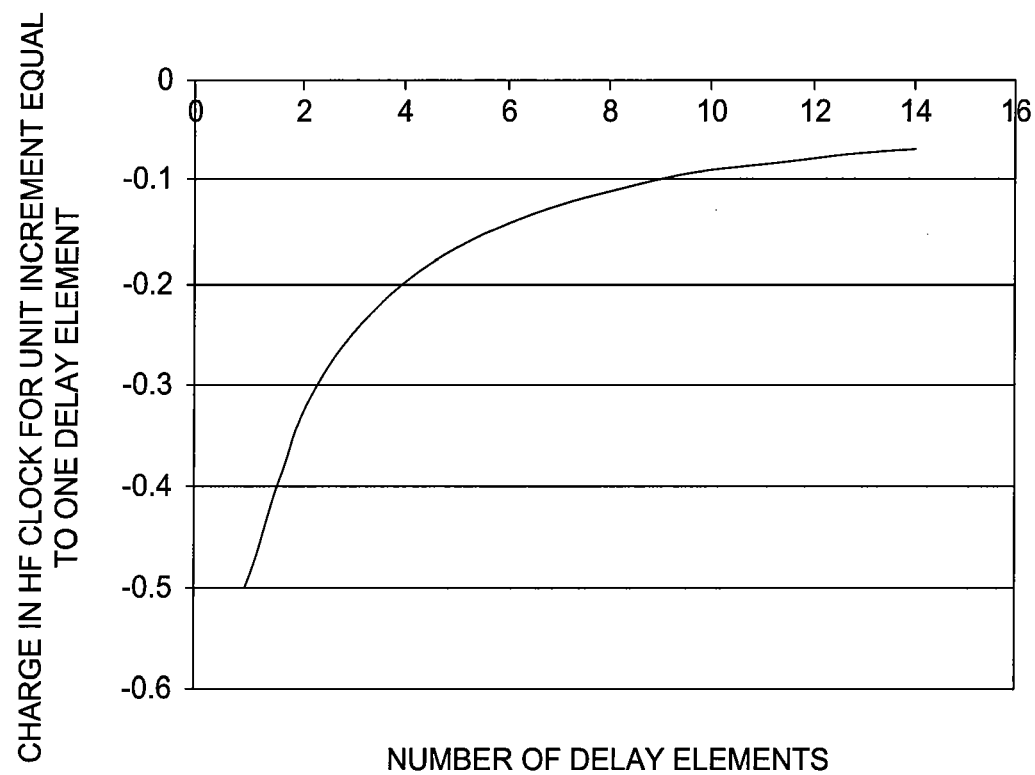
FIG. 7 is a graph illustrating operation of a pulse generator in accordance with an embodiment of the invention.

Therefore by varying the HF Clock frequency the delay between the quantized steps provided by the J delay elements may be linearized. By inspection, it can be seen that the maximum variation in HF Clock will be when M=1 and equal to a reduction in HF Clock frequency of 1 octave. This relationship is plotted in FIG. 7.

While the foregoing is directed to embodiments of the present invention, other and further embodiments of the invention may be devised without departing from the basic scope thereof, and the scope thereof is determined by the claims that follow.

The invention claimed is:

1. A pulse generator comprising:
an oscillator;
a selecting arrangement;
a plurality of variable delay elements of the same type arranged as first and second groups, each delay element having a delay control input for controlling the delay ($T_D$) provided by the element, the selecting arrangement being arranged to select how many of the delay elements of the first group are connected in series to an output of the pulse generator, the delay elements of the second group being connected in series, the inputs of the first and second groups being connected to the output of the oscillator;
a measuring circuit for repeatedly measuring the delay (IPD) provided by the second group;
a reference pulse generator for generating a series of reference pulses (RP), each of which is of predetermined duration (IRD) equal to a predetermined fraction of the period of output pulses (IF clock) of the oscillator; and
a control circuit whose output is connected to the delay control inputs of all of the delay elements and which is arranged to control the delay ($T_D$) provided by each element such that each measured delay (IPD) has a predetermined relationship with the predetermined duration (IRD).

2. The pulse generator as claimed in claim 1, wherein the control circuit is arranged to control the delay ($T_D$) such that each measured delay (IPD) is substantially equal to the predetermined duration (IRD).

3. The pulse generator as claimed in claim 1, wherein each delay element is arranged to provide a continuously variable delay.

4. The pulse generator as claimed in claim 1, wherein the selecting arrangement comprises a switching arrangement for connecting a selected number of the delay elements of the first group in series.

5. The pulse generator as claimed in claim 1, wherein the delay elements of the first group are connected in series and the selecting arrangement comprises a multiplexer for selectively connecting the output of any selected one of at least some of the delay elements to the output of the pulse generator.

6. The pulse generator as claimed in claim 1, wherein the measuring circuit is arranged to provide a series of pulses (IP), each of which has a duration (IPD) substantially equal to the total delay provided by the delay elements of the second group.

7. The pulse generator as claimed in claim 1, wherein the oscillator is of variable frequency.

8. The pulse generator as claimed in claim 1, wherein the oscillator comprises a clock and a frequency divider.

9. The pulse generator as claimed in claim 8, wherein the clock and the divider compose part of a phase locked loop (PLL).

10. The pulse generator as claimed in claim 1, wherein the reference pulse generator comprises a ring counter and a logic circuit.

11. The pulse generator as claimed in claim 1, wherein the oscillator comprises a clock, the reference pulse generator comprises a ring counter, and the ring counter is arranged to be clocked by the clock.

12. The pulse generator as claimed in claim 1, further comprising a third group of the delay elements, whose control inputs are connected to the output of the control circuit, and a further selecting arrangement for selecting how many of the delay elements of the third group are connected in series between the output of the oscillator and a further output of the pulse generator.

13. The pulse generator as claimed in claim 12, wherein the inputs of the first and third groups are connected to a phase generating arrangement.

14. The pulse generator as claimed in claim 13, wherein the phase generating arrangement is arranged to supply signals substantially in phase-quadrature to the inputs of the first and third groups.

15. An optical disc writer comprising a pulse generator, the pulse generator comprising:
an oscillator;
a selecting arrangement;
a plurality of variable delay elements of the same type arranged as first and second groups, each delay element having a delay control input for controlling the delay ($T_D$) provided by the element, the selecting arrangement being arranged to select how many of the delay elements of the first group are connected in series to an output of the pulse generator, the delay elements of the second group being connected in series, the inputs of the first and second groups being connected to the output of the oscillator;

a measuring circuit for repeatedly measuring the delay (IPD) provided by the second group;

a reference pulse generator for generating a series of reference pulses (RP), each of which is of predetermined duration (IRD) equal to a predetermined fraction of the period of output pulses (IF clock) of the oscillator; and a control circuit whose output is connected to the delay control inputs of all of the delay elements and which is arranged to control the delay ($T_D$) provided by each element such that each measured delay (IPD) has a predetermined relationship with the predetermined duration (IRD).

16. A tuner comprising a pulse generator, the pulse generator comprising:

an oscillator;

a selecting arrangement;

a plurality of variable delay elements of the same type arranged as first and second groups, each delay element having a delay control input for controlling the delay ($T_D$) provided by the element, the selecting arrangement being arranged to select how many of the delay elements of the first group are connected in series to an output of the pulse generator, the delay elements of the second group being connected in series, the inputs of the first and second groups being connected to the output of the oscillator;

a measuring circuit for repeatedly measuring the delay (IPD) provided by the second group;

a reference pulse generator for generating a series of reference pulses (RP), each of which is of predetermined duration (IRD) equal to a predetermined fraction of the period of output pulses (IF clock) of the oscillator; and a control circuit whose output is connected to the delay control inputs of all of the delay elements and which is arranged to control the delay ($T_D$) provided by each element such that each measured delay (IPD) has a predetermined relationship with the predetermined duration (IRD).

17. The tuner as claimed in claim 16, further comprising a frequency changer having a local oscillator that includes the pulse generator.

18. The tuner as claimed in claim 17, wherein the local oscillator is a quadrature local oscillator and the frequency changer is a quadrature frequency changer.

* * * * *